United States Patent [19]
Choi

[11] Patent Number: 5,953,618
[45] Date of Patent: Sep. 14, 1999

[54] METHOD OF FORMING A CAPACITOR FOR A SEMICONDUCTOR DEVICE

[75] Inventor: Jong-Moon Choi, Seoul, Rep. of Korea

[73] Assignee: LG Semicon Co., Ltd., Chungcheongbuk-do, Rep. of Korea

[21] Appl. No.: 08/720,966

[22] Filed: Oct. 10, 1996

[30] Foreign Application Priority Data

Dec. 22, 1995 [KR] Rep. of Korea ....................... 95-54389

[51] Int. Cl.$^6$ ................................................ H01L 21/8242
[52] U.S. Cl. ............................................ 438/396; 438/253
[58] Field of Search ................................... 438/253, 396, 438/254, 397; 257/306, 307, 308

[56] References Cited

U.S. PATENT DOCUMENTS

| | | |
|---|---|---|
| 4,970,564 | 11/1990 | Kimura et al. . |
| 5,140,389 | 8/1992 | Kimura et al. . |
| 5,150,276 | 9/1992 | Gonzalez et al. ........................ 438/396 |
| 5,744,833 | 4/1998 | Chao ........................................ 257/306 |
| 5,780,334 | 7/1998 | Lim et al. ................................ 438/253 |
| 5,801,079 | 9/1998 | Takaishi .................................. 438/396 |
| 5,821,139 | 10/1998 | Tseng ....................................... 438/253 |
| 5,849,617 | 12/1998 | Wu ........................................... 438/253 |

*Primary Examiner*—Peter Toby Brown
*Assistant Examiner*—Toniae M. Thomas

[57] ABSTRACT

A method of forming a capacitor for a semiconductor memory device, includes the steps of forming first and second insulating layers to form a first contact hole on a substrate, forming a first conductive layer and a third insulating layer within the first contact hole so as to define a second contact hole, forming a second conductive layer within the second contact hole, removing the second and third insulating layers to form a storage electrode, and forming a dielectric layer and a third conductive layer on the storage electrode to form a capacitor.

22 Claims, 6 Drawing Sheets

METHOD OF FORMING A CAPACITOR FOR A SEMICONDUCTOR DEVICE

FIELD OF THE INVENTION

The present invention relates to a method of forming a capacitor for a semiconductor device, whereby a formation process is simplified, product reliability is improved, and a method suitable for manufacturing high density DRAM memory cells is provided.

DESCRIPTION OF THE BACKGROUND ART

If a large amount of information is to be stored in a semiconductor memory device, the capacitance of a capacitor of a memory cell in the semiconductor memory device has to be increased per unit area.

Conventionally, in order to increase the capacitance per unit area, a FIN or cylindrical electrode was formed to increase the surface area of the storage electrode of the capacitor.

In this conventional method, however, the process for forming the FIN or cylindrical storage electrode becomes very complicated as the density of the DRAM cells increases. Consequently, various problems have arisen.

FIGS. 1A–1F illustrate a conventional method of forming a capacitor for a semiconductor device. The conventional method and the accompanying problems will be described referring to FIGS. 1A–1F.

First, as shown in FIG. 1A, an oxide layer or a nitride layer is deposited upon a substrate 11 having an impurity diffusion region 16. Then, an insulating layer 12 is formed thereon for insulating the substrate 11 from a conductive layer to be formed later.

Then, a mask pattern 17-1 is formed on the insulating layer 12 and then, utilizing the mask pattern 17-1, a portion of the insulating layer 12 which is formed above the impurity diffusion region 16 is etched, thereby forming a contact hole 18. This contact hole 18 is for electrically connecting the impurity diffusion region 16 to a storage electrode (node electrode) which is to be formed later.

Then, as shown in FIG. 1B, in order to form a storage electrode of the capacitor, a conductive layer 14 is formed within the contact hole 18 and on the insulating layer 12 using polysilicon.

Then, an oxide layer is formed upon the conductive layer 14 and then, a second mask pattern 17-2 is formed. Then, using the second mask pattern 17-2, the oxide layer is etched to form an oxide layer cylinder 13. This oxide layer cylinder 13 serves later as a support for forming an inner cylinder of a cylindrical storage electrode.

Then, as shown in FIG. 1C, another conductive layer 14-2 is deposited on the conductive layer 14 and the oxide layer cylinder 13.

Then, as shown in FIG. 1D, another oxide layer is formed on the conductive layer 14-2 and then, this oxide layer is etched back to form an insulating layer side wall 13-2 which is to serve as a support for forming an outer cylinder of a multi-layer cylinder.

Then, as shown in FIG. 1E, another conductive layer 14-3 is deposited and then, etching is carried out on the conductive layers to form three conductive layers 14-1, 14-2 and 14-3, such that the top of the insulating layer cylinder 13 is exposed.

Then, as shown in FIG. 1F, the oxide layer cylinder 13 and the insulating layer side wall 13-2 are removed, thereby forming a storage electrode 15-1 of the capacitor.

Then, a dielectric layer 15-2 is formed on the surface of the storage electrode 15-1 and then, polysilicon is deposited to form a plate electrode 15-3, thereby completing the formation of the capacitor.

In the conventional capacitor formed as described above, the height of the storage electrode 15-1 is formed such that the outer cylinder of the storage electrode 15-1 is smaller than the inner cylinder of the storage electrode 15-1.

Furthermore, sharp portions are formed on the leading ends of the cylinders. When the memory device is actually used, the electric field concentrates on these sharp portions of the cylinders. As a result, leakage current is increased and the reliability of the memory device is aggravated.

Moreover, when a multi-layer cylinder capacitor is manufactured, two mask processes are required which complicates the formation process.

SUMMARY OF THE INVENTION

The present invention is intended to overcome the above described disadvantages and problems of the conventional methods.

Therefore, it is an object of the present invention to provide a method for forming a capacitor for a semiconductor memory device, in which the formation process is simplified and the leading end of the cylinder portion does not include a sharp point, thereby improving the reliability of the memory device.

In achieving the above object, the method for forming a capacitor for a semiconductor memory device according to the embodiments of the present invention includes the steps of forming a first insulating layer on a substrate and forming a second insulating layer having a first contact hole upon the first insulating layer, forming a first conductive layer on the second insulating layer and the first contact hole, forming a third insulting layer upon the first conductive layer except the bottom portion of the first contact hole, etching the first conductive layer and the first insulating layer by using the third insulating layer as a mask to form a second contact hole, forming a second conductive layer on the third insulating layer and the second contact hole, removing portions of the first conductive layer, the third insulating layer and the second conductive layer, completely removing the second insulating layer and the third insulating layer to form a storage electrode of the capacitor, forming a dielectric layer upon the first conductive layer and the second conductive layer, and forming a third conductive layer upon the dielectric layer.

In removing the first conductive layer, the third insulating layer and the second conductive layer, a CMP (chemical mechanical polishing) process is used. In carrying out the CMP process, there is used a mechanical CMP process in which a slurry is used in small amount to polish off the conductive layers and the insulating layer in a ratio of 50:50. After removing the first conductive layer, the third insulating layer and the second conductive layer, a wet etching is carried out to completely remove the exposed second and third insulating layers.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a method of forming a capacitor for a semiconductor memory device, including the steps of forming first and second insulating layers to form a first contact hole on a substrate, forming a first conductive layer and a third insulating layer within the first contact hole so as to define a second contact hole, forming a second conductive layer within the second contact hole, removing the second and third insulating layers to form a storage electrode, and forming a dielectric layer and a third conductive layer on the storage electrode to form a capacitor.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENTS

The preferred embodiments of the present invention will be described in detail below referring to the attached drawings.

FIGS. 2A to 2F are sectional views for illustrating a method of forming a capacitor for a semiconductor memory device according to the embodiments of the present invention.

Figure 1A:
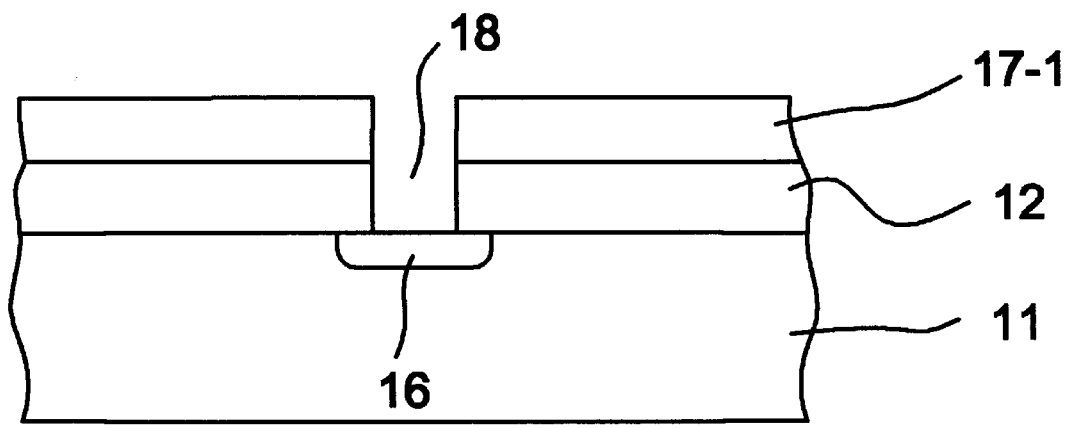
FIGS. 1A–1F are sectional views for illustrating a formation process of a conventional capacitor according to a conventional method.
Figure 1B:
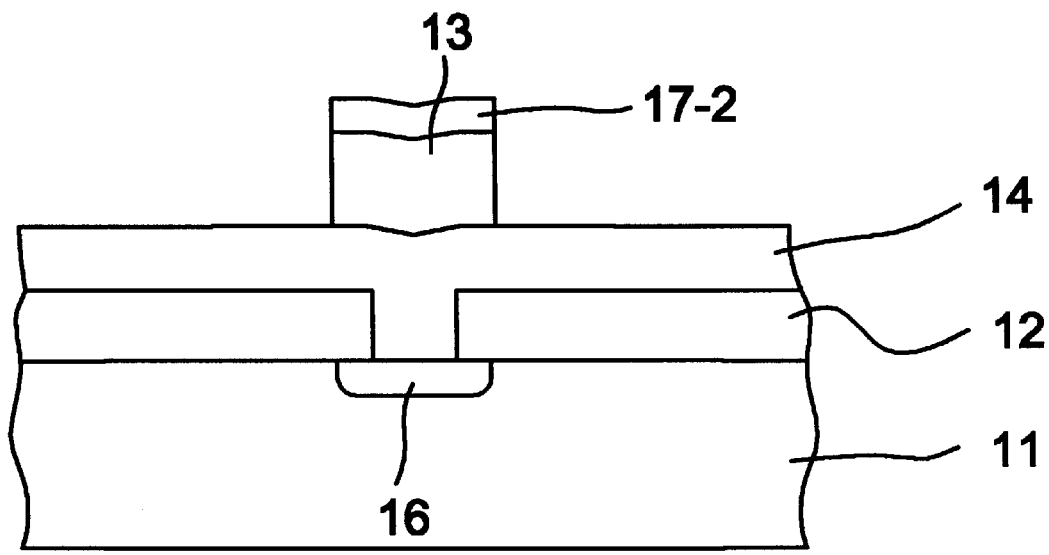
Figure 1C:
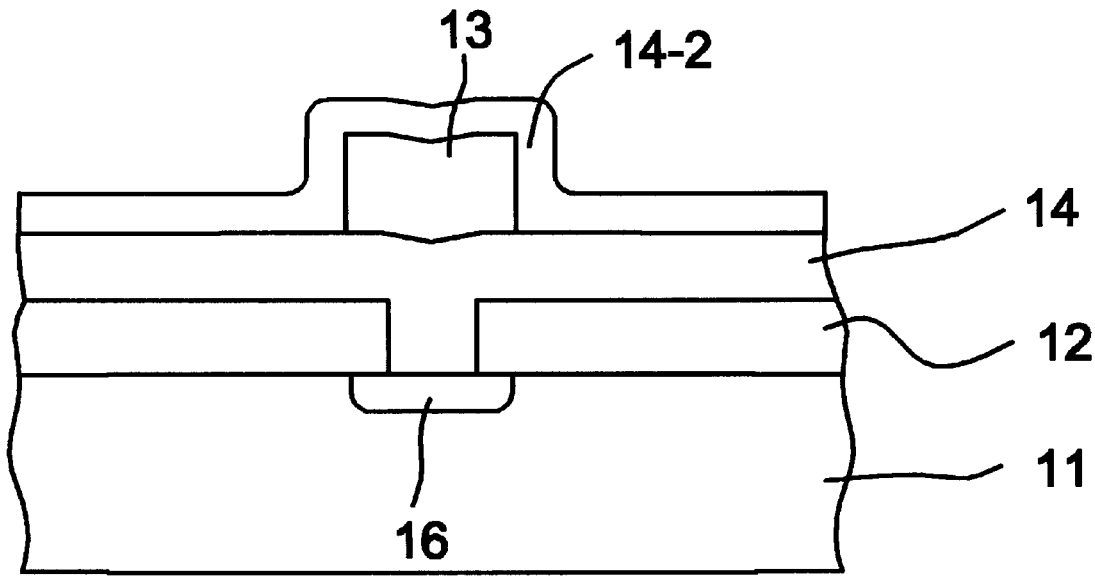
Figure 1D:
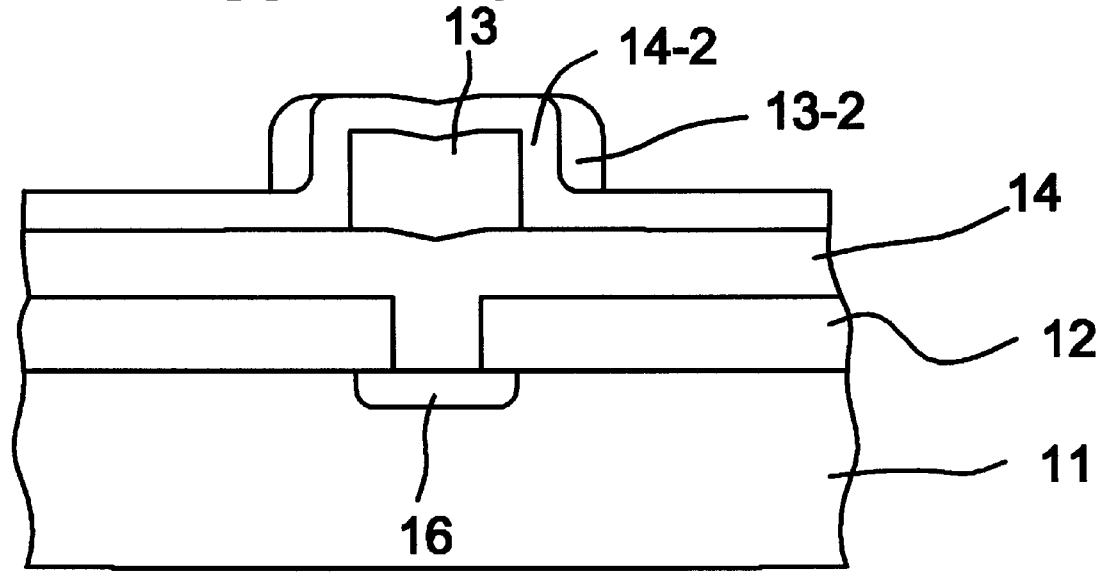
Figure 1E:
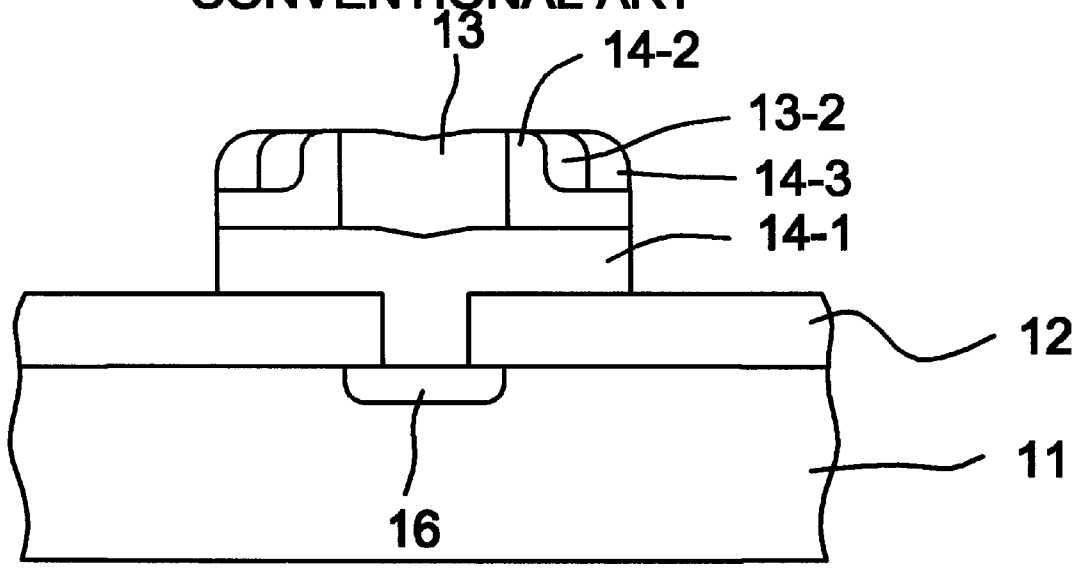
Figure 1F:
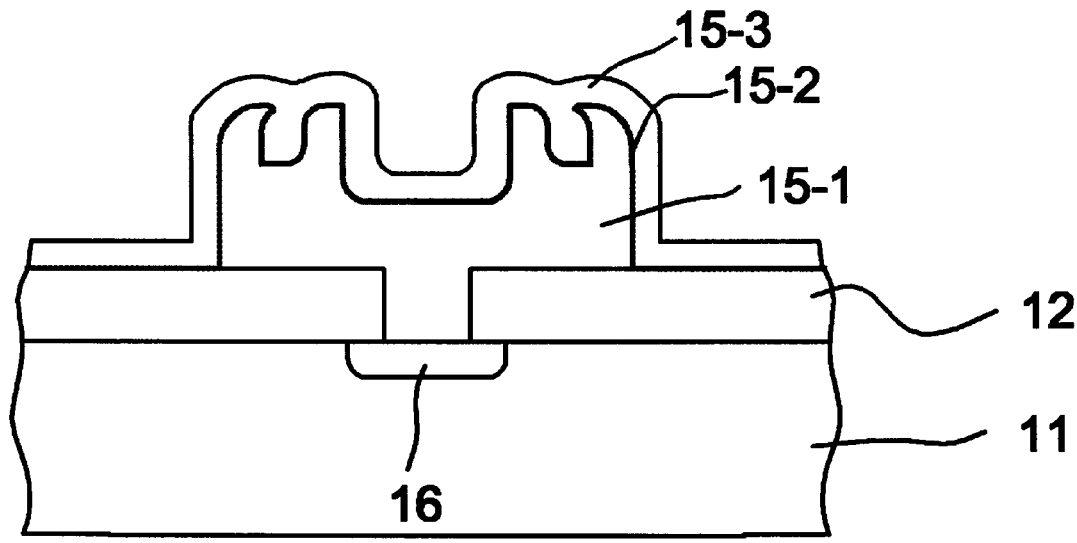
Figure 2A:
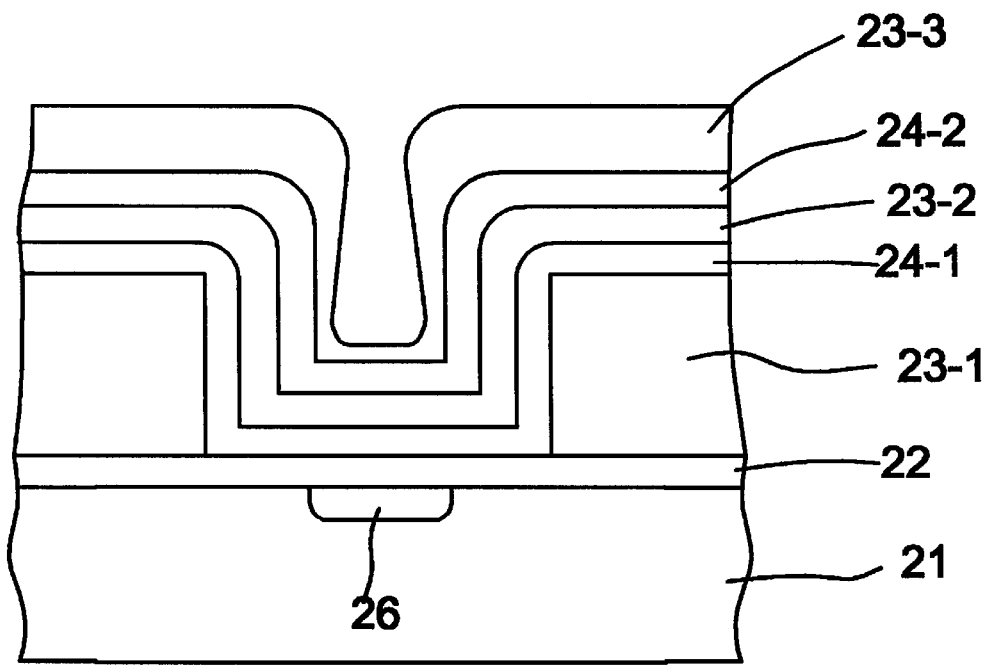
FIGS. 2A–2F are sectional views for illustrating a method of forming a capacitor for a semiconductor memory device according to the embodiments of the present invention.

First, as shown in FIG. 2A, in order to form an inter-layer insulation, a first insulating layer 22 is formed upon a substrate 21 having an impurity diffusion region 26 for electrical contact with an upper layer or a certain conductive layer region to be connected to a storage electrode of the capacitor. The first insulating layer 22 should preferably be composed of a nitride layer.

Then upon the first insulating layer 22, a second insulating layer 23-1 is formed in which a cylindrical hole is formed. This cylindrical hole will be called a cylinder hole or first contact hole, below. The first contact hole is formed in the following manner.

A photosensitive mask pattern is formed upon the second insulating layer 23-1 so as to remove a portion of the second insulating layer 23-1, on which a capacitor cylinder is to be formed. Then, a part of the second insulating layer 23-1 which is not protected by the photosensitive mask pattern is etched, thereby forming the first contact hole. That is, the second insulating layer 23-1 is etched to expose a portion of the first insulating layer 22 so as to form a cylindrical hole defined by the etched second insulating layer 23-1.

Here, the photosensitive mask pattern is formed in such a manner that a photosensitive film is spread, baking is carried out, and an exposure and development are performed.

Then, a first conductive layer 24-1 and a third insulating layer 23-2 are deposited into the cylindrical hole and upon the second insulating layer 23-1. Thereafter, a second conductive layer 24-2 and a fourth insulating layer 23-3 are deposited.

As shown in the drawings, the third insulating layer 23-2 and the second conductive layer 24-2 are formed between the first conductive layer 24-1 and the fourth insulating layer 23-3. Thus, by forming a multi-layer structure having many conductive layers and insulating layers, the capacitance of the capacitor can be increased. However, it is also sufficient to use only the first conductive layer 24-1 and the third insulating layer 23-2 (and not the second conductive layer 24-2 and the fourth insulating layer 23-3) to from the capacitor.

Whether in the form of a multi-layer structure or in the form of a single layer structure having only a conductive layer and an insulating layer, the uppermost insulating layer should be of a material having a characteristic of less 50% step coverage. This ensures that the thickness of the uppermost insulating layer in the hole is less than 50% of the thickness of the uppermost insulating layer outside of the hole.

That is, it is important that the thickness of the internal layer which is formed within the first contact hole is less than 50% of the thickness of the same layer formed outside of the first contact hole. When certain portions of the uppermost insulating layer, e.g., the fourth insulating layer 23-3, are etched later, other portions of the uppermost insulating layer remain along the side walls of the first contact hole. Since the remaining uppermost insulating layer is used as a mask to form a second contact hole, it is important to deposit a thin layer of the uppermost insulating layer within the first contact hole.

In the preferred embodiment of the present invention, the first conductive layer 24-1, the third insulating layer 23-2, the second conductive layer 24-2 and the fourth insulating layer 23-3 are alternately deposited. Here, these conductive layers are preferably composed of a polysilicon, and the insulating layers are preferably composed of an oxide.

The fourth insulating layer 23-3 which has the upper surface to hole surface thickness difference of more than 50% is composed of an oxide, e.g., a PSG (phosphor-silicate glass). This oxide insulating layer is formed thin within the hole and thicker outside the hole. Also, this insulating layer may be composed of any material which has an etch selectability with the conductive layers.

Figure 2B:
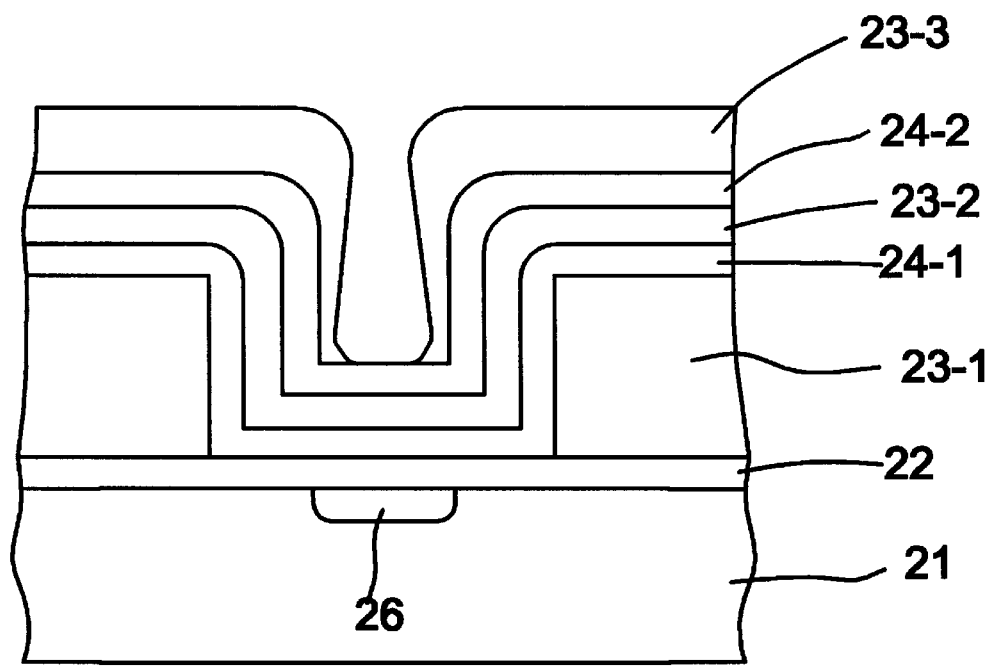

As shown in FIG. 2B, the uppermost oxide layer, i.e., the fourth insulating layer 23-3 is anisotropically etched so that the oxide layer on the bottom of the hole is removed. This exposes the second conductive layer 24-2 at the bottom of the hole. As explained above, the thickness of the fourth insulating layer 23-3 within the hole is less than the thickness of the fourth insulating layer 23-3 outside of the hole. Therefore, even if the fourth insulating layer within the hole is removed to expose the second conductive layer 24-2, the fourth insulating layer 23-3 disposed at the outside of the hole still remains.

Figure 2C:
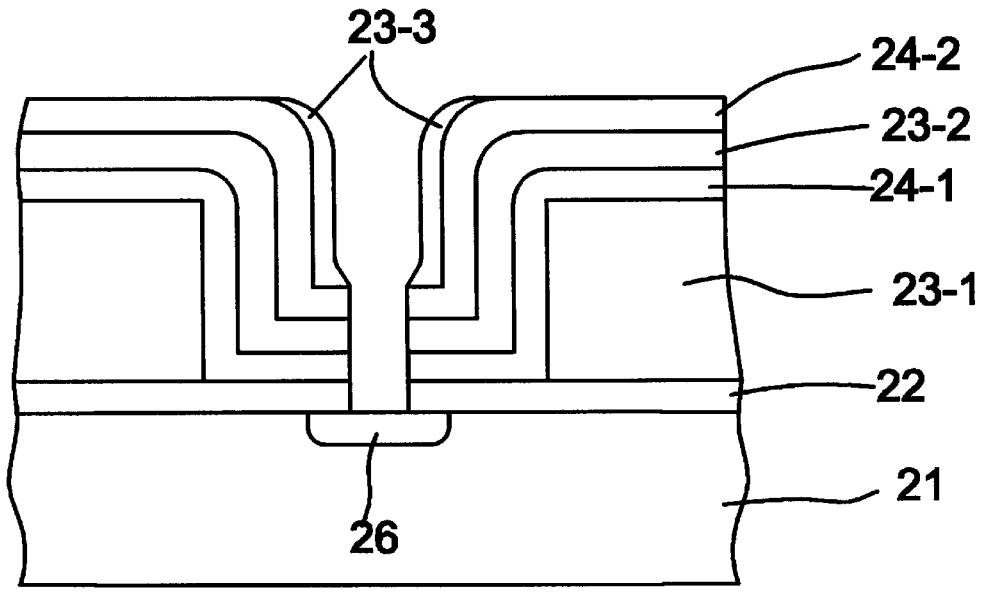

Then, as shown in FIG. 2C, by using the remaining fourth insulating layer 23-3 as a mask, the second conductive layer 24-2 which lies above the impurity diffusion region 26 is etched. Then, portions of the fourth insulating layer 23-3 are anisotropically etched so that the second conductive layer 24-2 is exposed. Then by using the remaining fourth insulating layer 23-3 as a mask, the third insulating layer 23-2, the first conductive layer 24-1 and the first insulating layer 22 are etched so as to expose the impurity diffusion region 26 of the substrate 21, thereby forming a second contact hole.

This second contact hole will be filled with a conductive material, so that it would serve as an electrical path between the impurity diffusion region 26 of the substrate 21 and a storage electrode of the capacitor to be formed later. Even in the case where a conductive layer is used instead of the diffusion region 26, etching is carried out so as to expose the conductive layer.

During the process of etching the second conductive layer 24-2, the third insulating layer 23-2 and the first conductive layer 24-1, the fourth insulating layer 23-3 is also etched so that only a portion of the fourth insulating layer 23-3 remains on the side wall of the first contact hole.

Figure 2D:
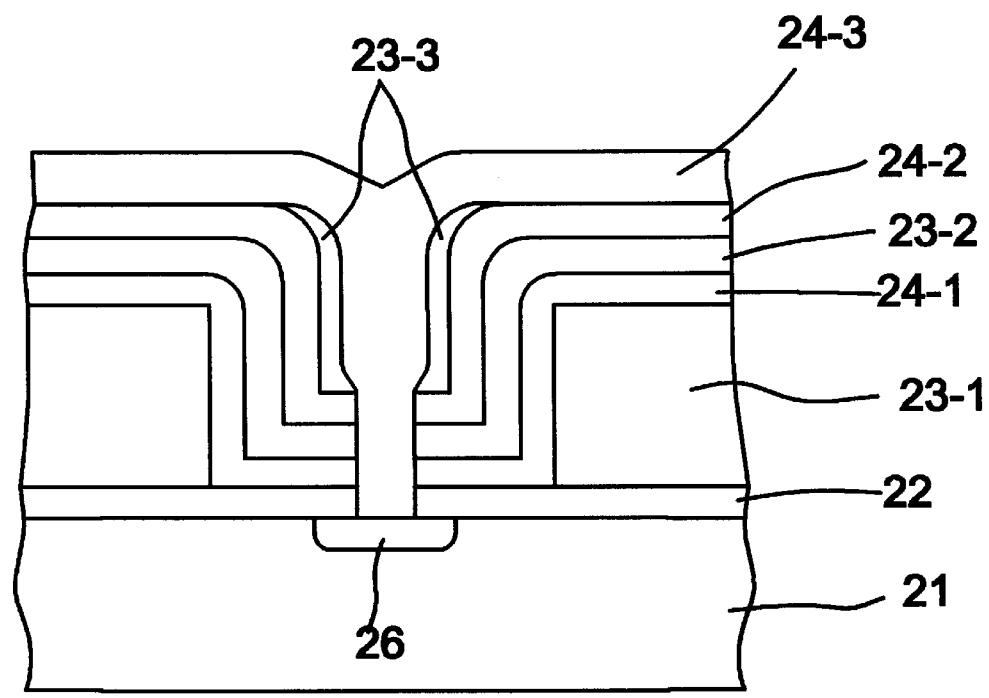

Then, as shown in FIG. 2D, a third conductive layer 24-3 is formed so that the second contact hole is completely filled up. The third conductive layer 24-3 is composed of a doped polysilicon.

Figure 2E:
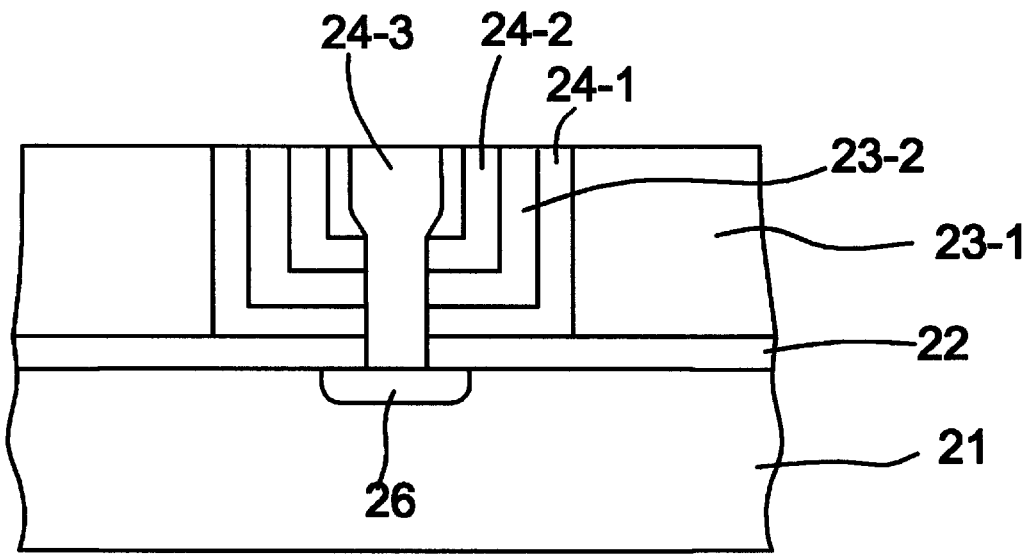

Then, as shown in FIG. 2E, a CMP (Chemical Mechanical Polishing) process is carried out to completely remove the upper insulating layers 23-3 and 23-2 and the conductive layers 24-3, 24-2 and 24-1, until the surface of the second insulating layer 23-1 is exposed. The CMP process used here is a mechanical CMP process in which a slurry is used in small amounts. Thus, the removals should be made such that the selectability ratio of the polysilicon layer to the oxide layer is 50:50.

Figure 2F:
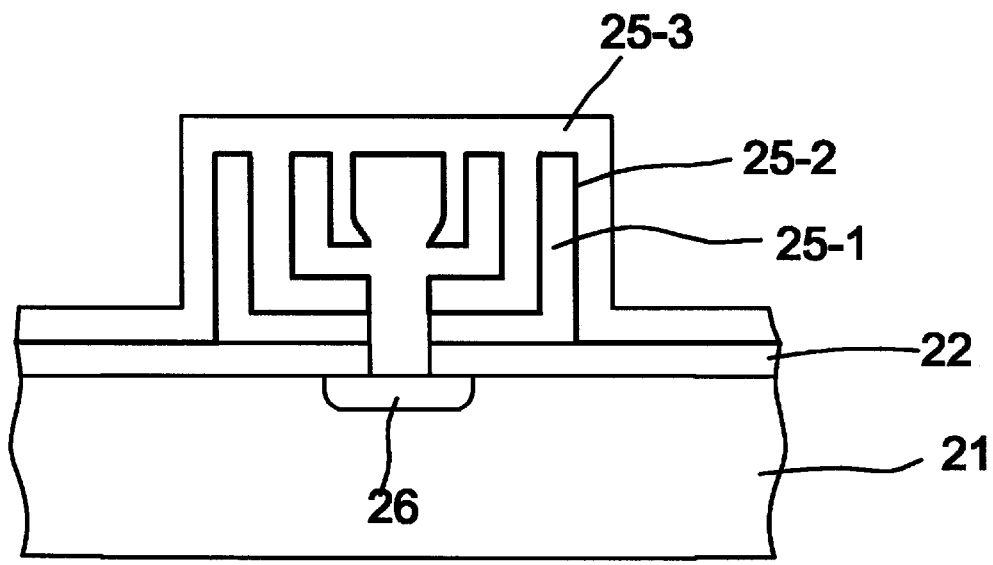

Then, as shown in FIG. 2F, an isotropic etching such as a wet etching is carried out to remove the fourth, third and second insulating layers 23-3, 23-2 and 23-1, thereby forming a storage electrode 25-1 of the capacitor. Then, a dielectric layer 25-2 is formed on the storage electrode 25-1 and a fourth conductive layer is deposited to form a plate electrode 25-3, thereby completing the formation process of the capacitor according to the present invention.

The present invention offers the following advantages. For example, a multi-layer cylinder and a contact hole are formed by using a single mask. Therefore, the formation process becomes simple.

Further, an etchback process is not applied during the formation of the cylinder and, therefore, sharp portions in the cylinders are not formed. As a result, leakage current is reduced and reliability of the dielectric layer is improved.

Furthermore, the heights of the inner and outer cylinders are made the same and, therefore, the capacitance of the capacitor is increased.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a capacitor for a semiconductor memory device, the method comprising the steps of:

forming first and second insulating layers on a substrate so as to define a first contact hole on the substrate;

forming a first conductive layer on said second insulating layer and within said first contact hole;

forming a third insulating layer on said first conductive layer and within said first contact hole;

removing portions of said third insulating layer, said first conductive layer and said first insulating layer so as to define a second contact hole on the substrate;

forming a second conductive layer on said third insulating layer and within said second contact;

removing portions of said first conductive layer, said third insulating layer and said second conductive layer so as to expose a surface of said second insulating layer;

removing said second and third insulating layers to form a storage electrode;

forming a dielectric layer on said storage electrode; and forming a third conductive layer on said dielectric layer so as to form a capacitor.

2. The method as claimed in claim 1, wherein said second insulating layer includes a material having an etch selectability with said first insulating layer.

3. The method as claimed in claim 1, wherein said first insulating layer includes a silicon nitride, and said second insulating layer includes an oxide.

4. The method as claimed in claim 1, further comprising the steps of:

forming a fourth conductive layer and a fourth insulating layer between said third insulating layer and said second conductive layer; and removing portions of said fourth conductive layer and said fourth insulating layer to form the second contact hole.

5. The method as claimed in claim 1, wherein a deposition thickness of said third insulating layer within said first contact hole is less than 50% of a depositing thickness of said third insulating layer outside said first contact hole.

6. The method as claimed in claim 5, wherein said third insulating layer includes phosphor-silicate glass (PSG).

7. The method as claimed in claim 1, wherein said first, second and third conductive layers are composed of polysilicon, and said first and second insulating layers are composed of silicon oxide.

8. The method as claimed in claim 4, wherein said fourth conductive layer is composed of polysilicon, and said fourth insulating layer is composed of silicon oxide.

9. The method as claimed in claim 1, wherein said step of removing a portion of said first conductive layer, said third insulating layer and said second conductive layer includes the step of:

performing a chemical-mechanical polishing (CMP) process on said first conductive layer, said third insulating layer and said second conductive layer, so as to polish off said first and second conductive layers and said third insulating layer at a ratio of about 50:50.

10. The method as claimed in claim 1, wherein, after removing said first conductive layer, said third insulating layer and said second conductive layer, a wet etching is carried out to remove the exposed second and third insulating layers.

11. The method as claimed in claim 1, wherein said storage electrode includes a plurality of inner and outer cylinders having substantially a same height and a substantially same configuration.

12. A method of forming a capacitor for a semiconductor device, the method comprising the steps of:

forming first and second insulating layers to define a first contact hole on a substrate;

forming a first conductive layer and a third insulating layer within the first contact hole;

first removing portions of the first insulating layer, the first conductive layer and the third insulating layer to define a second contact hole on the substrate;

forming a second conductive layer within the second contact hole;

second removing at least portions of the first and second conductive layers and the second and third insulating layers to form a storage electrode; and forming a dielectric layer and a third conductive layer on the storage electrode to form a capacitor.

13. The method as claimed in claim 12, further comprising the steps of:

forming a fourth conductive layer and a fourth insulating layer between the third insulating layer and the second conductive layer; and removing portions of the fourth conductive layer and the fourth insulating layer to define the second contact hole.

14. The method as claimed in claim 12, wherein a deposition thickness of the third insulating layer within the first contact hole is less than 50% of a depositing thickness of the third insulating layer outside the first contact hole.

15. The method as claimed in claim 12, wherein the first, second and third conductive layers are composed of polysilicon, and the first and second insulating layers are composed of silicon oxide.

16. The method as claimed in claim 13, wherein the fourth conductive layer is composed of polysilicon, and the fourth insulating layer is composed of silicon oxide.

17. The method as claimed in claim 12, wherein said step of forming a first conductive layer and a third insulating layer includes the step of:

depositing the first conductive layer and the third insulating layer on the second insulating layer and within the first contact hole.

18. The method as claimed in claim 17, wherein said first removing step includes the steps of:

initially removing a portion of the third insulating layer to expose a bottom of the first contact hole; and then etching the first conductive layer and the first insulating layer using a remaining portion of the third insulating layer to define the second contact hole on the substrate.

19. The method as claimed in claim 17, wherein said second removing step includes the step of:

performing a chemical-mechanical polishing (CMP) process on the first conductive layer and the third insulating layer so as to expose a surface of the second insulating layer.

20. The method as claimed in claim 19, wherein said second removing step further includes the steps of:

completely removing said second and third insulating layers after said performing step.

21. The method as claimed in claim 12, wherein the storage electrode includes a plurality of inner and outer cylinders having substantially a same height and a substantially same configuration.

22. The method as claimed in claim 12, wherein said step of forming a second conductive layer completely fills the second contact hole with the second conductive layer.

* * * * *